US011732357B2

(12) United States Patent
Takahashi et al.

(10) Patent No.: US 11,732,357 B2
(45) Date of Patent: Aug. 22, 2023

(54) SUBSTRATE PROCESSING METHOD AND SUBSTRATE PROCESSING APPARATUS

(71) Applicant: Tokyo Electron Limited, Tokyo (JP)

(72) Inventors: Tsuyoshi Takahashi, Nirasaki Yamanashi (JP); Mitsuhiro Okada, Nirasaki Yamanashi (JP); Yasushi Fujii, Nirasaki Yamanashi (JP); Yu Nunoshige, Nirasaki Yamanashi (JP); Shinji Kawasaki, Nirasaki Yamanashi (JP); Hirotaka Kuwada, Nirasaki Yamanashi (JP); Toshio Takagi, Nirasaki Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 121 days.

(21) Appl. No.: 16/892,766

(22) Filed: Jun. 4, 2020

(65) Prior Publication Data

US 2020/0392622 A1 Dec. 17, 2020

(30) Foreign Application Priority Data

Jun. 11, 2019 (JP) .................. 2019-108977

(51) Int. Cl.
*C23C 16/455* (2006.01)
*C23C 16/458* (2006.01)
(Continued)

(52) U.S. Cl.
CPC .... *C23C 16/45544* (2013.01); *C23C 16/4408* (2013.01); *C23C 16/4554* (2013.01);
(Continued)

(58) Field of Classification Search
CPC .......... C23C 16/45544; C23C 16/4408; C23C 16/45527; C23C 16/4554;
(Continued)

(56) References Cited

U.S. PATENT DOCUMENTS 5,574,247 A * 11/1996 Nishitani ................ C23C 16/54
118/712
10,121,650 B1 * 11/2018 Kamakura ........ H01L 21/02104
(Continued)

FOREIGN PATENT DOCUMENTS

JP 2006-283172 A 10/2006
JP 2009-521594 A 6/2009
(Continued)

*Primary Examiner* — Jeffrie R Lund
(74) *Attorney, Agent, or Firm* — Nath, Goldberg & Meyer; Jerald L. Meyer; Tanya E. Harkins

(57) ABSTRACT

A substrate processing method in substrate processing apparatus comprises repeating cycle including: supplying source gas into process container causing the source gas to be adsorbed to substrate; exhausting excess source gas from the process container; supplying reaction gas into the process container causing the reaction gas to react with the source gas; and exhausting excess reaction gas, wherein at least one of a gap width between placement stage and member forming processing space between the member and the stage and degree of opening of pressure adjustment valve in at least one of the supplying the source gas and the supplying the reaction gas is smaller than at least one of a gap width between the stage and the member and the degree of opening of the pressure adjustment valve in at least one of the exhausting the excess source gas and the exhausting the excess reaction gas, respectively.

17 Claims, 12 Drawing Sheets

(51) Int. Cl.
*C23C 16/52* (2006.01)
*C23C 16/44* (2006.01)

(52) U.S. Cl.
CPC .... *C23C 16/4582* (2013.01); *C23C 16/45527* (2013.01); *C23C 16/45557* (2013.01); *C23C 16/52* (2013.01)

(58) Field of Classification Search
CPC .......... C23C 16/45557; C23C 16/4582; C23C 16/52; C23C 16/4585; C23C 16/4412; C23C 16/34; H01L 21/28506; H01L 21/0228; H01L 21/02186; H01L 21/68742
See application file for complete search history.

(56) References Cited

U.S. PATENT DOCUMENTS

| | | | |
|---|---|---|---|
| 11,217,432 B2* | 1/2022 | Sawachi | H01J 37/32834 |
| 2006/0000411 A1* | 1/2006 | Seo | C23C 16/45544 |
| | | | 438/758 |
| 2007/0116887 A1* | 5/2007 | Faguet | C23C 16/515 |
| | | | 700/121 |
| 2007/0116888 A1* | 5/2007 | Faguet | H01J 37/32623 |
| | | | 700/121 |
| 2007/0235319 A1* | 10/2007 | Cerio, Jr. | H01J 37/32431 |
| | | | 204/192.1 |
| 2010/0279008 A1* | 11/2010 | Takagi | H01L 21/02197 |
| | | | 118/725 |
| 2016/0358767 A1* | 12/2016 | Nitta | C23C 16/45557 |
| 2017/0047227 A1* | 2/2017 | Kaga | C23C 16/45557 |
| 2019/0287843 A1* | 9/2019 | Yahata | C23C 16/405 |
| 2020/0048764 A1* | 2/2020 | Kuwada | C23C 16/45544 |
| 2020/0392622 A1* | 12/2020 | Takahashi | C23C 16/4582 |
| 2021/0043425 A1* | 2/2021 | Sawachi | C23C 16/45561 |
| 2022/0068637 A1* | 3/2022 | Miyatani | C23C 16/45561 |
| 2022/0189779 A1* | 6/2022 | Takahashi | H01J 37/3244 |

FOREIGN PATENT DOCUMENTS

| | | |
|---|---|---|
| JP | 2011-060936 A | 3/2011 |
| JP | 2017-5016 A | 1/2017 |
| JP | 2018-150612 A | 9/2018 |
| KR | 20140109834 A * | 9/2014 |

* cited by examiner

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2019-108977, filed on Jun. 11, 2019, the entire contents of which are incorporated herein by reference.

TECHNICAL FIELD

The present disclosure relates to a substrate processing method and a substrate processing apparatus.

BACKGROUND

For example, it is known to use a TiN film as a barrier metal of a word line of a 3D NAND.

Patent Document 1 discloses a method of forming a thin film on a substrate using a vapor deposition system, in which the method includes a disposing step of disposing a substrate in the vapor deposition system in which a processing space is defined above the substrate, a step of introducing a gaseous thin film precursor into the processing space, an enlarging step of enlarging a volume of the processing space from a first size to a second size following introduction of the thin film precursor into the processing space to form an enlarged processing space, a step of introducing a reducing gas into the enlarged processing space, and a step of forming a reducing plasma from the reducing gas.

PRIOR ART DOCUMENT

Patent Document

Patent Document 1: Japanese Laid-Open Patent Publication No. 2009-521594

SUMMARY

According to an embodiment of the present disclosure, there is provided a substrate processing method in a substrate processing apparatus comprising: a process container including a placement stage configured to place a substrate thereon and be capable of moving up or down; a member configured to form a processing space between the member and the placement stage; a source gas supply configured to supply a source gas into the process container; a reaction gas supply configured to supply a reaction gas into the process container; and an exhauster including a pressure adjustment valve configured to be capable of adjusting a degree of opening thereof, and exhaust a gas in the process container, the method includes repeating a cycle, the cycle including: supplying the source gas into the process container causing the source gas to be adsorbed to the substrate; exhausting excess source gas from the process container; supplying the reaction gas into the process container causing the reaction gas to react with the source gas; and exhausting excess reaction gas from the process container, wherein at least one of a gap width between the placement stage and the member and the degree of opening of the pressure adjustment valve in at least one of the supplying the source gas into the process container causing the source gas to be adsorbed to the substrate and the supplying the reaction gas into the process container causing the reaction gas to react with the source gas is smaller than at least one of a gap width between the placement stage and the member and the degree of opening of the pressure adjustment valve in at least one of the exhausting the excess source gas from the container and the exhausting the excess reaction gas from the container, respectively.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Processing Apparatus>

Figure 1:
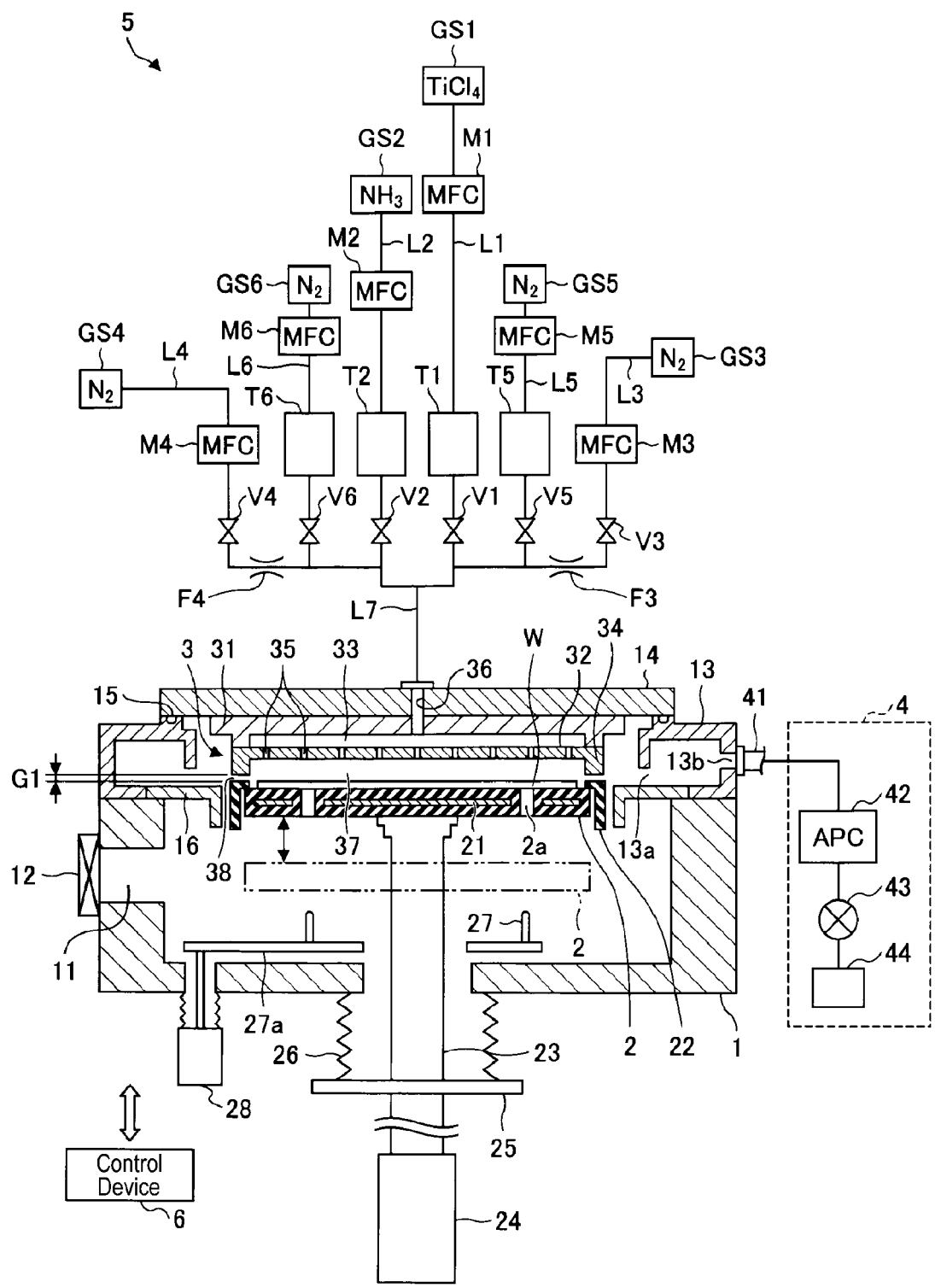
FIG. 1 is an exemplary schematic cross-sectional view of a substrate processing apparatus according to an embodiment of the present disclosure.
Figure 2:
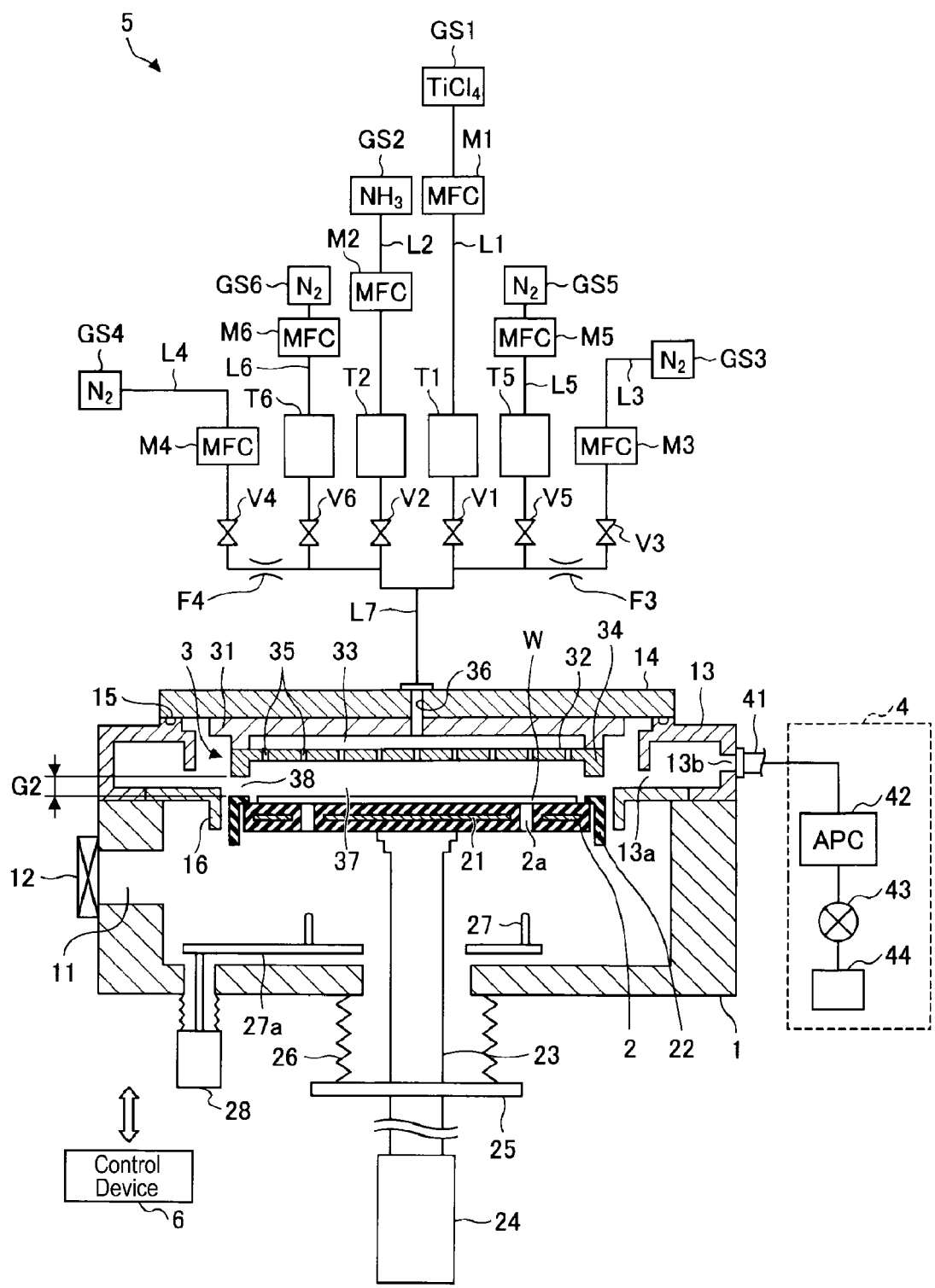
FIG. 2 is an exemplary schematic cross-sectional view of a substrate processing apparatus according to an embodiment of the present disclosure.

A substrate processing apparatus 100 according to the present embodiment will be described with reference to FIGS. 1 and 2. FIGS. 1 and 2 are exemplary schematic cross-sectional views of the substrate processing apparatus 100 according to an embodiment of the present disclosure.

The substrate processing apparatus 100 supplies TiCl₄ gas as a source gas and NH₃ gas as a reaction gas to a substrate W such as a wafer so as to form a TiN film as a metal-containing film on the surface of the substrate W. The substrate processing apparatus 100 includes, for example, an atomic layer deposition (ALD) apparatus or the like.

As illustrated in FIGS. 1 and 2, the substrate processing apparatus 100 includes a process container 1, a substrate placement stage 2, a shower head 3, an exhaust part (or an exhauster) 4, a processing gas supply mechanism 5, and a control device (or a controller) 6.

The process container 1 is made of a metal such as aluminum, and has a substantially cylindrical shape. A loading/unloading port 11 is formed in a side wall of the process container 1 to load or unload a substrate W therethrough, and the loading/unloading port 11 is configured to be capable of being opened/closed by a gate valve 12. An annular exhaust duct 13 having a rectangular cross section is provided on a main body of the process container 1. The exhaust duct 13 has a slit 13a formed along an inner peripheral surface thereof. In addition, an exhaust port 13b is formed in an outer wall of the exhaust duct 13. On an upper surface of the exhaust duct 13, a ceiling wall 14 is provided so as to close an upper opening of the process container 1. A space between the ceiling wall 14 and the exhaust duct 13 is hermetically sealed with a seal ring 15. A partition member 16 partitions an inside of the process container 1 into upper and lower portions when the substrate placement stage 2 (and a cover member 22) is raised to a processing position (a first processing position or a second processing position) to be described later.

The substrate placement stage 2 horizontally supports the substrate W in the process container 1. The substrate placement stage 2 is formed in a disk shape having a size corresponding to the substrate W, and is supported by a support member 23. The substrate placement stage 2 is made of a ceramics material such as aluminum nitride (AlN) or a metal material such as aluminum or a nickel-based alloy, and a heater 21 is embedded in the substrate placement stage 2 in order to heat the substrate W. The heater 21 is heated from power supplied by a heater power supply (not illustrated). Then, by controlling the output of the heater 21 by a temperature signal of a thermocouple (not illustrated) provided in the vicinity of a substrate placement surface of a top surface of the substrate placement stage 2, the substrate W is controlled to have a predetermined temperature.

The substrate placement stage 2 is provided with a cover member 22 made of ceramics such as alumina so as to cover an outer peripheral area of the wafer placement surface and a side surface of the substrate placement stage 2.

The support member 23 extends to a lower side of the process container 1 through a hole formed in a bottom wall of the process container 1 from a center of a bottom surface of the substrate placement stage 2, and a lower end of the support member 23 is connected to a lifting mechanism 24. By the lifting mechanism 24, the substrate placement stage 2 is configured to be capable of moving up or down via the support member 23 among a first processing position indicated by a solid line in FIG. 1, a second processing position indicated by a solid line in FIG. 2, and a transport position indicated by a two-dot chain line below the second processing position in FIG. 1. At the transport position, the substrate W can be transported. In addition, a flange 25 is provided on the support member 23 below the process container 1, and a bellows 26, which partitions an atmosphere within the process container 1 from the outside air, is provided between the bottom surface of the process container 1 and the flange 25 to expand and contract as the substrate placement stage 2 moves up or down.

Three substrate support pins 27 (of which only two are illustrated) are provided in the vicinity of the bottom surface of the process container 1 so as to protrude upward from a lifting plate 27a. The substrate support pins 27 are configured to be capable of moving up or down via the lifting plate 27a by the lifting mechanism 28 provided below the process container 1, and are inserted into through holes 2a provided in the substrate placement stage 2 located at the transport position so as to be capable of protruding or receding with respect to the top surface of the substrate placement stage 2. By causing the substrate support pins 27 to move up or down in this manner, the substrate W is delivered between the wafer transport mechanism (not shown) and the substrate placement stage 2.

The shower head 3 supplies a processing gas into the process container 1 in a shower form. The shower head 3 is made of a metal and is provided to face the substrate placement stage 2. The shower head 3 has a diameter, which is substantially equal to that of the substrate placement stage 2. The shower head 3 includes a main body 31 fixed to the ceiling wall 14 of the process container 1 and a shower plate 32 connected to a lower side of the main body 31. A gas diffusion space 33 is formed between the main body 31 and the shower plate 32. In the gas diffusion space 33, a gas inlet hole 36 is provided through the centers of the main body 31 and the ceiling wall 14 of the process container 1. An annular protrusion 34 protruding downward is formed at a peripheral edge portion of the shower plate 32, and gas ejection holes 35 are formed in a flat surface inside the annular protrusion 34 of the shower plate 32.

In the state in which the substrate placement stage 2 is located at the processing position, a processing space 37 is formed between the shower plate 32 and the substrate placement stage 2, and the annular protrusion 34 and the top surface of the cover member 22 of the substrate placement stage 2 are close to each other so as to form an annular gap 38 therebetween. Here, a gap width G1 (see FIG. 1) in the state in which the substrate placement stage 2 is at the first processing position is narrower than a gap width G2 (see FIG. 2) when the substrate placement stage 2 is at the second processing position. In the state in which the substrate placement stage 2 is at the first processing position, the top surface of the cover member 22 is disposed above the top surface of the partition member 16. In the state in which the substrate placement stage 2 is at the second processing position, the top surface of the cover member 22 is disposed below the top surface of the partition member 16.

The exhaust part 4 evacuates the interior of the process container 1. The exhaust part 4 includes an exhaust pipe 41 connected to the exhaust port 13b of the exhaust duct 13, an auto pressure controller (APC) valve 42, an opening/closing valve 43, and a vacuum pump 44. One end of the exhaust pipe 41 is connected to the exhaust port 13b of the exhaust duct 13, and the other end is connected to a suction port of the vacuum pump 44. The APC valve 42 and the opening/closing valve 43 are provided between the exhaust duct 13 and the vacuum pump 44 in this order from the upstream side. The APC valve 42 adjusts a conductance of the exhaust path so as to adjust a pressure in the processing space 37. The opening/closing valve 43 switches opening and closing of the exhaust pipe 41. During processing, the partition member 16 and the substrate placement stage 2 (the cover member 22) partition the inside of the process container 1 into an upper space including the processing space 37 and a lower space on the rear surface side of the substrate placement stage 2. As a result, the gas in the processing space 37 reaches the annular space inside the exhaust duct 13 through the annular gap 38 and the slit 13a, and is exhausted from the exhaust port 13b of the exhaust duct 13 through the exhaust pipe 41 by the vacuum pump 44 of the exhaust part 4. The lower space is turned into a purge atmosphere by a purge gas supply mechanism (not illustrated). Therefore, the gas in the processing space 37 does not flow into the lower space.

The processing gas supply mechanism 5 includes a source gas supply line (or a source gas supply) L1, a reaction gas supply line (or a reaction gas supply) L2, a first continuous $N_2$ gas supply line (or a carrier gas supply) L3, a second continuous $N_2$ gas supply line (or a carrier gas supply) L4, a first flash purge line L5, and a second flash purge line L6.

The source gas supply line L1 extends from a source gas supply source GS1, which is a supply source for a metal-containing gas (e.g., $TiCl_4$ gas), and is connected to a junction pipe L7. The junction pipe L7 is connected to the gas inlet hole 36. The source gas supply line L1 is provided with a mass flow controller M1, a buffer tank T1, and an opening/closing valve V1 in this order from the source gas supply source GS1 side. The mass flow controller M1 controls a flow rate of the $TiCl_4$ gas flowing through the source gas supply line L1. The buffer tank T1 temporarily stores the $TiCl_4$ gas, and supplies necessary $TiCl_4$ gas in a short time. The opening/closing valve V1 switches the supply and stop of the $TiCl_4$ gas during an ALD process.

The reaction gas supply line L2 extends from a reaction gas supply source GS2, which is a supply source for reaction gas (e.g., $NH_3$ gas), and is connected to the junction pipe L7. The reaction gas supply line L2 is provided with a mass flow controller M2, a buffer tank T2, and an opening/closing valve V2 in this order from the reaction gas supply source GS2 side. The mass flow controller M2 controls a flow rate of $NH_3$ gas flowing through the reaction gas supply line L2. The buffer tank T2 temporarily stores the $NH_3$ gas, and supplies necessary $NH_3$ gas in a short time. The opening/closing valve V2 switches the supply and stop of the $NH_3$ gas during an ALD process.

The first continuous $N_2$ gas supply line L3 extends from an $N_2$ gas supply source GS3, which is a supply source of $N_2$ gas, and is connected to the source gas supply line L1. Thus, the $N_2$ gas is supplied to the source gas supply line L1 side through the first continuous $N_2$ gas supply line L3. The first continuous $N_2$ gas supply line L3 constantly supplies the $N_2$ gas during film formation through an ALD method, and the $N_2$ gas functions as a carrier gas of $TiCl_4$ gas and also functions as a purge gas. The first continuous $N_2$ gas supply line L3 is provided with a mass flow controller M3, an opening/closing valve V3, and an orifice F3 in this order from the $N_2$ gas supply source GS3 side. The mass flow controller M3 controls the flow rate of the $N_2$ gas flowing through the first continuous $N_2$ gas supply line L3. The orifice F3 suppresses a backflow of a gas, supplied by the buffer tanks T1 and T5 and having a relatively high flow rate, into the first continuous $N_2$ gas supply line L3.

The second continuous $N_2$ gas supply line L4 extends from an $N_2$ gas supply source GS4, which is a supply source for $N_2$ gas, and is connected to the reaction gas supply line L2. Thus, the $N_2$ gas is supplied to the reaction gas supply line L2 side through the second continuous $N_2$ gas supply line L4. The second continuous $N_2$ gas supply line L4 constantly supplies $N_2$ gas during film formation through an ALD method, and the $N_2$ gas functions as a carrier gas of $NH_3$ gas and also functions as a purge gas. The second continuous $N_2$ gas supply line L4 is provided with a mass flow controller M4, an opening/closing valve V4, and an orifice F4 in this order from the $N_2$ gas supply source GS4 side. The mass flow controller M4 controls the flow rate of the $N_2$ gas flowing through the second continuous $N_2$ gas supply line L4. The orifice F4 suppresses a backflow of a relatively high flow rate of a gas supplied by the buffer tanks T2 and T6 into the second continuous $N_2$ gas supply line L4.

The first flash purge line L5 extends from an $N_2$ gas supply source GS5, which is a supply source for $N_2$ gas, and is connected to the first continuous $N_2$ gas supply line L3. Thus, the $N_2$ gas is supplied to the source gas supply line L1 side through the first flash purge line L5 and the first continuous $N_2$ gas supply line L3. The first flash purge line L5 supplies $N_2$ gas only in a purge step during film formation through an ALD method. The first flash purge line L5 is provided with a mass flow controller M5, a buffer tank T5, and an opening/closing valve V5 in this order from the $N_2$ gas supply source GS5 side. The mass flow controller M5 controls the flow rate of the $N_2$ gas flowing through the first flash purge line L5. The buffer tank T5 temporarily stores the $N_2$ gas, and supplies necessary $N_2$ gas in a short time. The opening/closing valve V5 switches the supply and stop of the $N_2$ gas during purge in an ALD process.

The second flash purge line L6 extends from an $N_2$ gas supply source GS6, which is a supply source for $N_2$ gas, and is connected to the second continuous $N_2$ gas supply line L4. Thus, $N_2$ gas is supplied to the reaction gas supply line L2 side through the second flash purge line L6 and the second continuous $N_2$ gas supply line L4. The second flash purge line L6 supplies $N_2$ gas only in a purge step during film formation through an ALD method. The second flash purge line L6 is provided with a mass flow controller M6, a buffer tank T6, and an opening/closing valve V6 in this order from the $N_2$ gas supply source GS6 side. The mass flow controller M6 controls the flow rate of the $N_2$ gas flowing through the second flash purge line L6. The buffer tank T6 temporarily stores the $N_2$ gas, and supplies necessary $N_2$ gas in a short time. The opening/closing valve V6 switches the supply and stop of the $N_2$ gas during purge in an ALD process.

The control device 6 controls the operation of each part of the substrate processing apparatus 100. The control device 6 includes a central processing unit (CPU), a read only memory (ROM), and a random access memory (RAM). The CPU executes a desired process according to a recipe stored in a storage area of, for example, the RAM. In the recipe, apparatus control information for a process condition is set. The control information may be, for example, gas flow rate, pressure, temperature, and process time. The recipe and a program used by the control device 6 may be stored in, for example, a hard disc or a semiconductor memory. In addition, for example, the recipe and the like may be set at a predetermined position to be read out in the state of being stored in a storage medium readable by a portable computer, such as a CD-ROM or a DVD.

<Film Forming Process>

Figure 3:
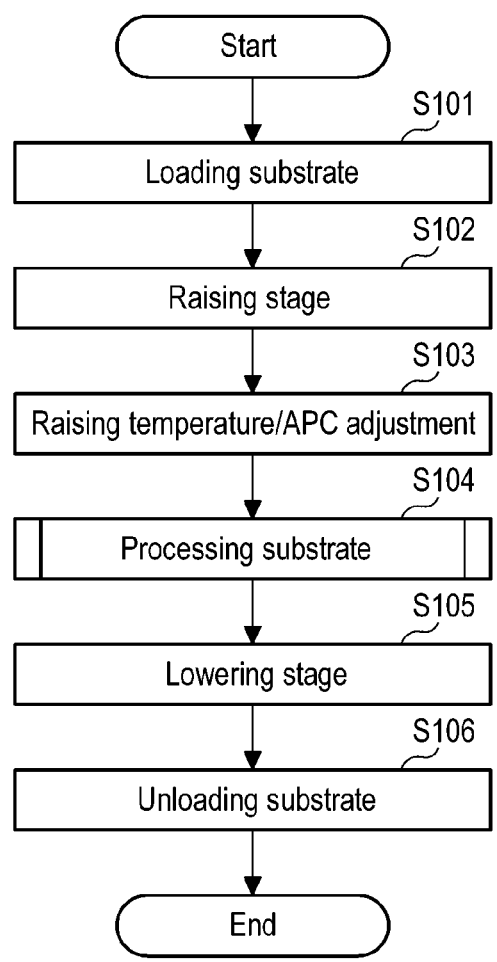
FIG. 3 is a flowchart illustrating exemplary a film formation process in a substrate processing apparatus according to an embodiment of the present disclosure.

Next, a film forming process using the substrate processing apparatus 100 will be described with reference to FIG. 3. FIG. 3 is a flowchart illustrating exemplary film formation in the substrate processing apparatus 100 according to an embodiment of the present disclosure.

In step S101, a substrate W is loaded into the process container 1 of the substrate processing apparatus 100. Specifically, in the state in which the substrate placement stage 2 heated to a predetermined temperature (e.g., 300 degrees C. to 700 degrees C.) by the heater 21 is lowered to the transport position (indicated by the two-dot chain line in FIG. 1), the gate valve 12 is opened. Subsequently, a substrate W is loaded into the process container 1 through the loading/unloading port 11 by a transport arm (not illustrated), and is supported by the substrate support pins 27. When the transport arm retreats from the loading/unloading port 11, the gate valve 12 is closed. In addition, the substrate W is placed on the substrate placement stage 2 by lowering the substrate support pins 27.

In step S102, the control device 6 controls the lifting mechanism 24 to raise the substrate placement stage (stage) 2 to the processing position (the first processing position or the second processing position). Thus, the inside of the process container 1 is partitioned into an upper space on the side of the surface of the substrate placement stage 2 (the substrate placement surface) including the processing space 37 and a lower space on the side of the rear surface of the substrate placement stage 2.

In step S103, the temperature of the substrate W on the substrate placement stage 2 is raised, and a degree of opening of the APC valve 42 is adjusted. That is, the substrate W on the substrate placement stage 2 is heated to a predetermined temperature by the heater 21. In addition, the control device 6 controls the exhaust part 4 to adjust the inside of the process container 1 to a predetermined degree of vacuum. Thereafter, the control device 6 opens the opening/closing valves V3 and V4 and closes the opening/closing valves V1, V2, V5, and V6. Thus, the $N_2$ gas is supplied from the $N_2$ gas supply sources GS3 and GS4 to the processing space 37 via the first continuous $N_2$ gas supply line L3 and the second continuous $N_2$ gas supply line L4 so as to increase the pressure. In addition, the control device 6 adjusts the degree of opening of the APC valve 42 at which the pressure in the processing space 37 reaches a desired pressure, based on a pressure sensor (not illustrated) that detects the pressure in the processing space 37. Thus, the control device 6 stores the pressure in the processing space 37 and the degree of opening of the APC valve 42 in association with each other. In this case, $TiCl_4$ gas is supplied from the source gas supply source GS1 into the buffer tank T1, and thus the pressure in the buffer tank T1 is maintained substantially constant. In addition, $N_2$ gas is supplied from the $N_2$ gas supply sources GS5 and GS6 into the buffer tanks T5 and T6, and thus the pressure in the buffer tanks T5 and T6 is maintained substantially constant.

In step S104, substrate processing for forming a TiN film on the substrate W is performed. This processing will be described later with reference to FIG. 4. When the substrate processing is completed, the flow advances to step S105.

In step S105, the control device 6 controls the lifting mechanism 24 to lower the substrate placement stage 2 to the transport position.

In step S106, the substrate W is unloaded from the process container 1 of the substrate processing apparatus 100. Specifically, the substrate support pins 27 are raised, and the substrate W placed on the substrate placement stage 2 is raised and supported by the substrate support pins 27. Further, the gate valve 12 is opened. Subsequently, the substrate W is unloaded from the process container 1 through the loading/unloading port 11 by a transport arm (not illustrated). When the transport arm retreats from the loading/unloading port 11, the gate valve 12 is closed. As described above, the processing for forming the TiN film on the substrate W in the substrate processing apparatus 100 is terminated.

Figure 4:
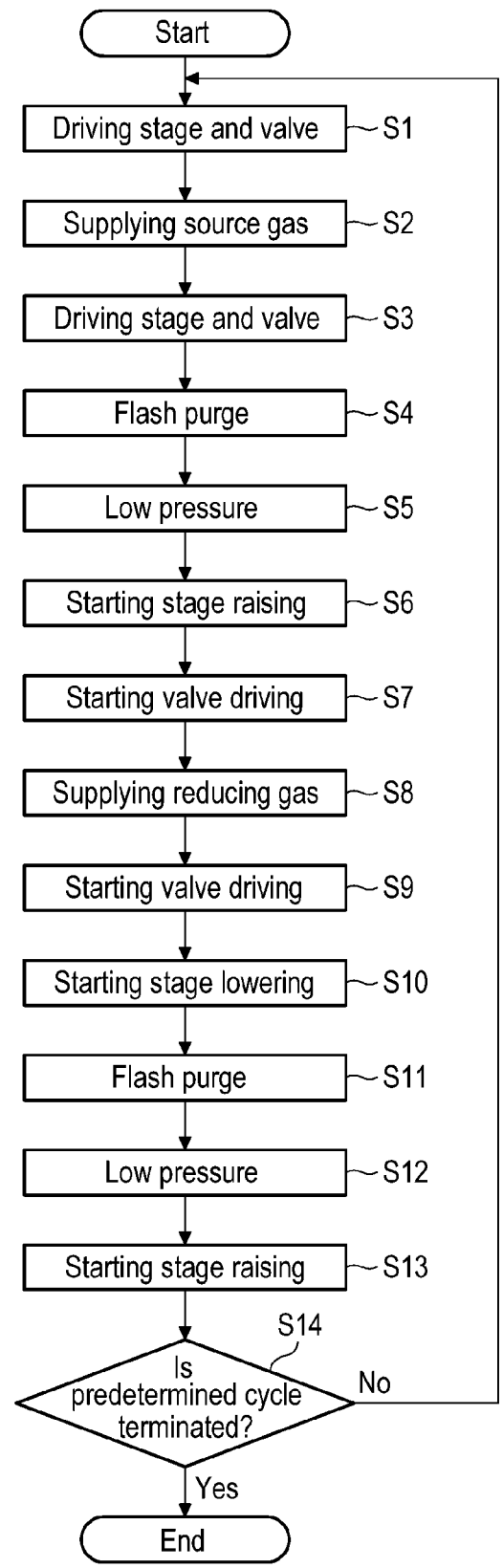
FIG. 4 is a flowchart illustrating an exemplary substrate processing method in a substrate processing apparatus according to an embodiment of the present disclosure.
Figure 5:
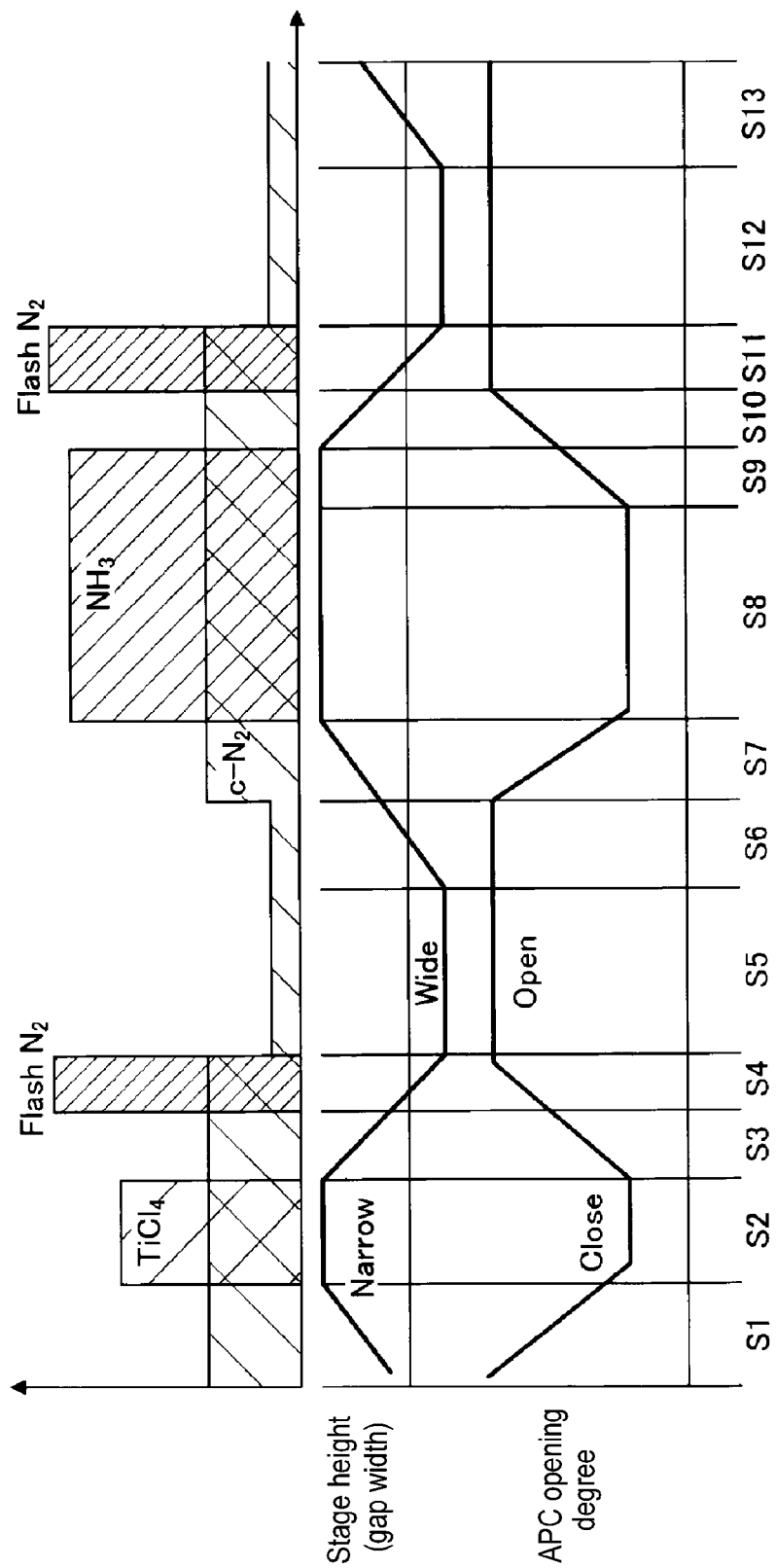
FIG. 5 is a time chart illustrating an exemplary control of gas supply, gap width, and degree of opening of an APC (or APC opening degree).
Figure 6:
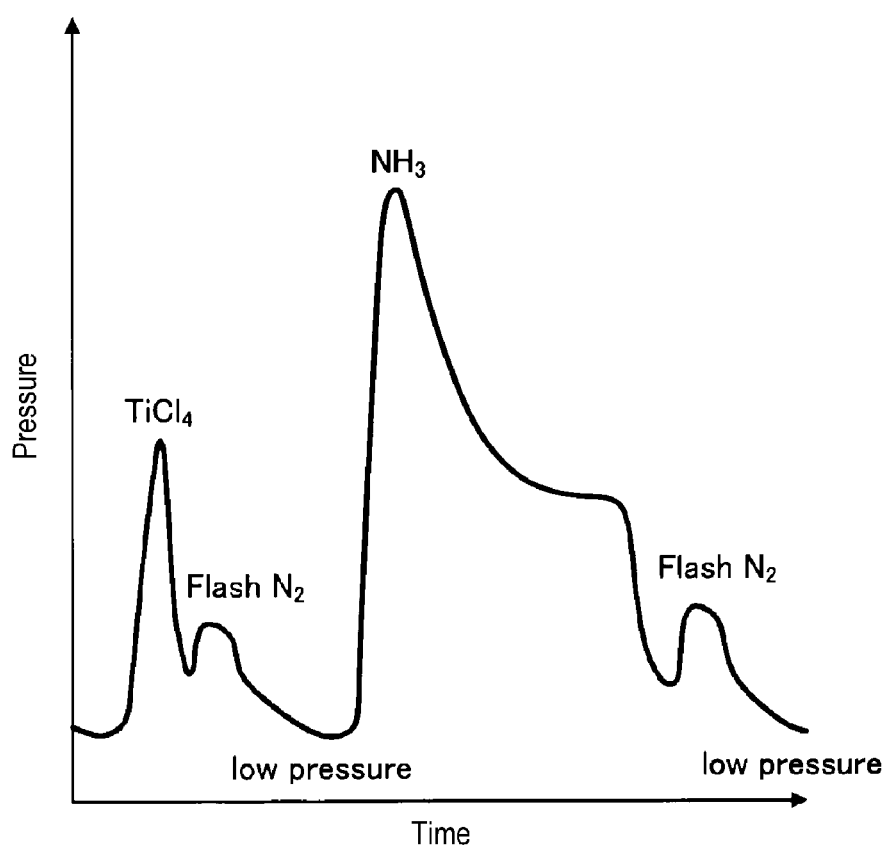
FIG. 6 is a view illustrating an exemplary pressure fluctuation in one cycle.

Next, the substrate processing in step S104 will be further described with reference to FIGS. 4 to 7D. FIG. 4 is a flowchart illustrating an exemplary substrate processing method in the substrate processing apparatus 100 according to the present embodiment. FIG. 5 is a time chart illustrating an exemplary control of gas supply, gap width, and the degree of opening of the APC. FIG. 6 is a view illustrating an exemplary pressure fluctuation in one cycle. FIGS. 7A to 7D are exemplary model diagrams in substrate processing.

In addition, an upper portion of FIG. 5 represents gas supply, a vertical axis represents the flow rate of the supplied gases, and a horizontal axis represents time. A middle portion of FIG. 5 represents the positions of the substrate placement stage 2 in the height direction, a vertical axis represents the height of the substrate placement stage 2, and the horizontal axis represents time. That is, in the graph in the middle portion of FIG. 5, a larger value on the vertical axis indicates a narrower gap width, and a smaller value on the vertical axis indicates a wider gap width. A lower portion of FIG. 5 represents the degree of opening of the APC valve 42, a vertical axis represents the degree of opening of the APC valve 42, and the horizontal axis represents time. In FIG. 6, a vertical axis represents pressure, and a horizontal axis represents time. FIGS. 7A to 7D illustrate holes and grooves having a high aspect ratio as an example of a structure 200 of a substrate W. The structure 200 may be applied to a rib-shaped three-dimensional structure having a vertical groove extending vertically and a horizontal groove extending horizontally from the vertical groove.

In step S1, the control device 6 controls the lifting mechanism 24 to start a raising operation of moving (raising) the substrate placement stage 2 to the first processing position (see FIG. 1) (indicated as "Narrow" in FIG. 5), and to start a closing operation in which the degree of opening of the APC valve 42 is set to a first degree of opening (indicated as "Close" in FIG. 5). Here, the first degree of opening is a smaller (closed side) degree of opening than a second opening described later. The value of the first opening is determined, based on the pressure described in the recipe and the relationship between the pressure and the degree of opening stored in step S103. In addition, the control device 6 sets the flow rates of the mass flow controllers M3 and M4 (the flow rate of the carrier $N_2$ gas indicated as "c-$N_2$" in FIG. 5) to a predetermined flow rate set in the recipe. Further, the carrier $N_2$ gas is supplied from the $N_2$ gas supply sources GS3 and GS4 to the processing space 37 via the first continuous $N_2$ gas supply line L3 and the second continuous $N_2$ gas supply line L4.

Figure 7A:
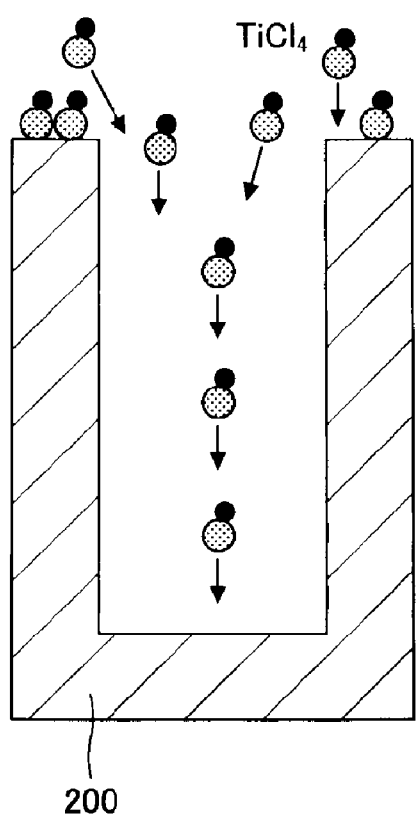
FIGS. 7A to 7D are exemplary model diagrams in substrate processing.

In step S2, the control device 6 opens the opening/closing valve V1, and supplies $TiCl_4$ gas, which is a source gas, into the processing space 37. Here, the gap width G1 of the annular gap 38 is set to be smaller than the gap width G2 (e.g., 0.5 mm), and the degree of opening (the first degree of opening) of the APC valve 42 is also set to be smaller than the second degree of opening described later. For this reason, the $TiCl_4$ gas supplied into the processing space 37 is sealed in the processing space 37, and the pressure in the processing space 37 increases as represented in FIG. 6. Thus, since the supplied $TiCl_4$ gas is not immediately exhausted, it is possible to increase a frequency of contact between source gas molecules and the structure 200 of the substrate W. In addition, as illustrated in FIG. 7A, the source gas can be supplied to the inside of the complicated structure 200, and the source gas molecules can be adsorbed on the surface of the structure 200.

In step S3, the control device 6 closes the opening/closing valve V1. In addition, the control device 6 controls the lifting mechanism 24 to start a lowering operation of moving (lowering) the substrate placement stage 2 to the second processing position (see FIG. 2) (indicated as "Wide" in FIG. 5), and to start an opening operation in which the degree of opening of the APC valve 42 is set to a second degree of opening (indicated as "Open" in FIG. 5). Here, the second degree of opening is a larger (opening side) degree of opening than the first opening. The value of the second degree of opening is determined, based on the pressure described in the recipe and the relationship between the pressure and the degree of opening stored in step S103.

Figure 7B:
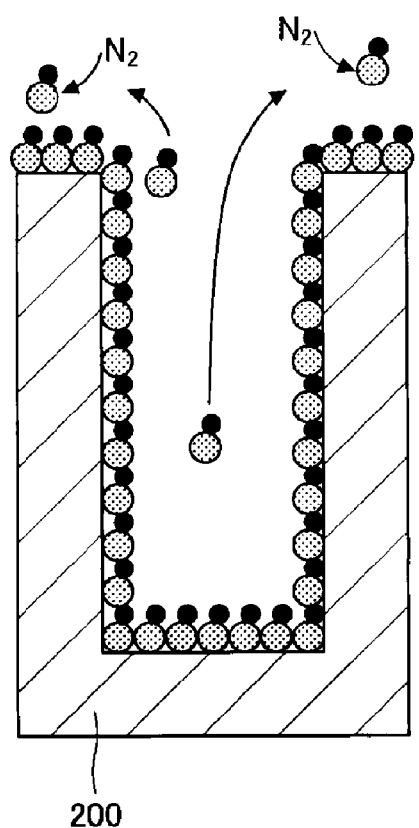

In step S4, the control device 6 opens the opening/closing valves V5 and V6, and supplies $N_2$ gas (indicated by "Flash $N_2$" in FIG. 5) into the processing space 37. In this case, since the $N_2$ gas is temporarily stored in the buffer tanks T5 and T6 and is then supplied into the process container 1, the $N_2$ gas may be supplied at a relatively high flow rate. The gap width of the annular gap 38 is set to be wider than the gap width G1, and the degree of opening of the APC valve 42 is also set to be larger than the first degree of opening. Thus, as illustrated in FIG. 7B, the excess $TiCl_4$ gas or the like in the processing space 37 is flash-purged. FIG. 5 illustrates that the flash purge is started during the lowering operation of the substrate placement stage 2 and during the opening operation of opening of the APC valve 42. However, the present disclosure is not limited to this, and the flash purge may be performed after the lowering operation of the placement stage 2 is completed and after the degree of opening adjustment of the APC valve 42 is completed.

In step S5, the control device 6 closes the opening/closing valves V5 and V6. In addition, the control device 6 makes the flow rates (the flow rates of the carrier $N_2$ gas) of the mass flow controllers M3 and M4 smaller than the flow rates during the supply of the source gas (step S2) and during the flash purge (step S4). The gap width G2 of the annular gap 38 is set to be larger than the gap width G1 (e.g., 6 mm), and the degree of opening (the second degree of opening) of the APC valve 42 is also set to be larger than the first degree of opening. Therefore, the exhaust conductance from the processing space 37 to the vacuum pump 44 can be reduced, and as illustrated in FIG. 6, the pressure in the processing space 37 is turned into a low pressure (indicated by "low pressure" in FIG. 6). As a result, as illustrated in FIG. 7B, excess $TiCl_4$ gas, $N_2$ gas, and the like in the structure 200 can be easily discharged.

In step S6, the control device 6 controls the lifting mechanism 24 to start the raising operation of moving (raising) the substrate placement stage 2 to the first processing position (see FIG. 1).

In step S7, the control device 6 starts a closing operation in which the degree of opening of the APC valve 42 is set to the first opening. Further, the control device 6 makes the flow rates (the flow rates of the carrier $N_2$ gas) of the mass flow controllers M3 and M4 larger than the flow rates in steps S5 and S6. For example, the flow rates are returned to the flow rates of steps S1 to S4.

Figure 7C:
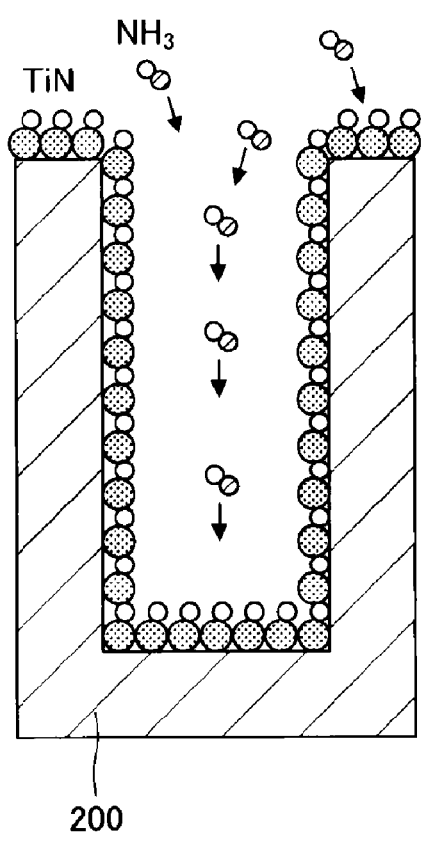

In step S8, the control device 6 opens the opening/closing valve V2, and supplies $NH_3$ gas, which is a reaction gas, into the processing space 37. Here, the gap width G1 of the annular gap 38 is set to be smaller than the gap width G2 (e.g., 0.5 mm), and the degree of opening (the first degree of opening) of the APC valve 42 is also set to be smaller than the second degree of opening. For this reason, the $NH_3$ gas supplied into the processing space 37 is sealed in the processing space 37, and the pressure in the processing space 37 increases as represented in FIG. 6. Thus, since the supplied $NH_3$ gas is not immediately exhausted, it is possible to increase the frequency of contact between reaction gas molecules and the structure 200 of the substrate W. Further, as illustrated in FIG. 7C, the reaction gas can be supplied to the inside of the complicated structure 200, and can react with the source gas molecules adsorbed on the surface of the structure 200.

In step S9, the control device 6 starts an opening operation in which the degree of opening of the APC valve 42 is set to the second opening.

In step S10, the control device 6 closes the opening/closing valve V2. In addition, the control device 6 controls the lifting mechanism 24 to start the lowering operation of moving (lowering) the substrate placement stage 2 to the second processing position (see FIG. 2).

Figure 7D:
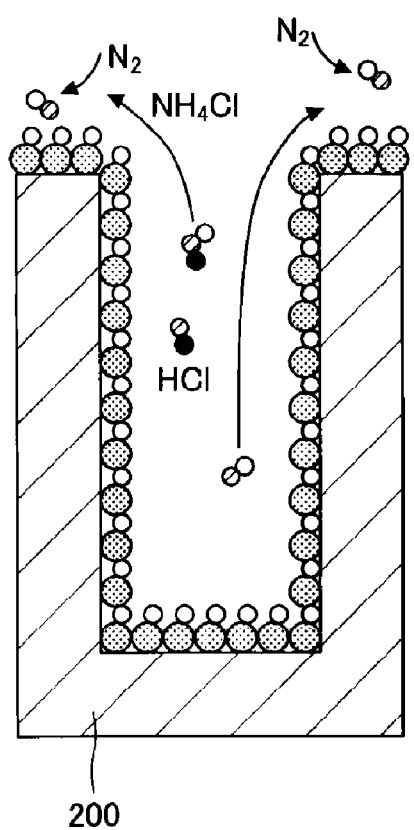

In step S11, the control device 6 opens the opening/closing valves V5 and V6, and supplies $N_2$ gas (indicated by "Flash $N_2$" in FIG. 5) into the processing space 37. At this time, since the $N_2$ gas is temporarily stored in the buffer tanks T5 and T6 and is then supplied into the process container 1, the $N_2$ gas may be supplied at a relatively high flow rate. The gap width of the annular gap 38 is set to be larger than the gap width G1, and the degree of opening (the second degree of opening) of the APC valve 42 is also set to be larger than the first degree of opening. Thus, as illustrated in FIG. 7D, the reaction products ($NH_4Cl$ gas and HCl gas), the excess $NH_3$ gas, and the like in the processing space 37 are flash-purged. FIG. 5 illustrates that the flash purge is started during the lowering operation of the substrate placement stage 2 after the opening operation of the APC valve 42 is completed, but the present disclosure is not limited thereto.

In step S12, the control device 6 closes the opening/closing valves V5 and V6. In addition, the control device 6 makes the flow rates (the flow rates of the carrier $N_2$ gas) of the mass flow controllers M3 and M4 smaller than the flow rates during the supply of the reaction gas (steps S8 and S9) and during the flash purge (step S11). The gap width G2 of the annular gap 38 is set to be larger than the gap width G1 (e.g., 6 mm), and the degree of opening (the second degree of opening) of the APC valve 42 is also set to be larger than the first degree of opening. Therefore, the exhaust conductance from the processing space 37 to the vacuum pump 44 can be reduced, and as illustrated in FIG. 6, the pressure in the processing space 37 is turned into a low pressure (indicated by "low pressure" in FIG. 6). Thus, as illustrated in FIG. 7D, the reaction products ($NH_4Cl$ gas and HCl gas), the excess $NH_3$ gas and $N_2$ gas, and the like in the structure 200 can be easily discharged.

In step S13, the control device 6 controls the lifting mechanism 24 to start the raising operation of moving (raising) the substrate placement stage 2 to the first processing position (see FIG. 1). By the processing of these steps S1 to S13, one cycle of the ALD process is terminated.

In step S14, the control device 6 determines whether or not a predetermined number of cycles have been terminated. When the predetermined number of cycles has not been terminated (S14, "No"), steps S1 to S13 are repeated until the predetermined number of cycles are terminated. If the predetermined number of cycles have been terminated (S14, Yes), the process is terminated.

Figure 8:
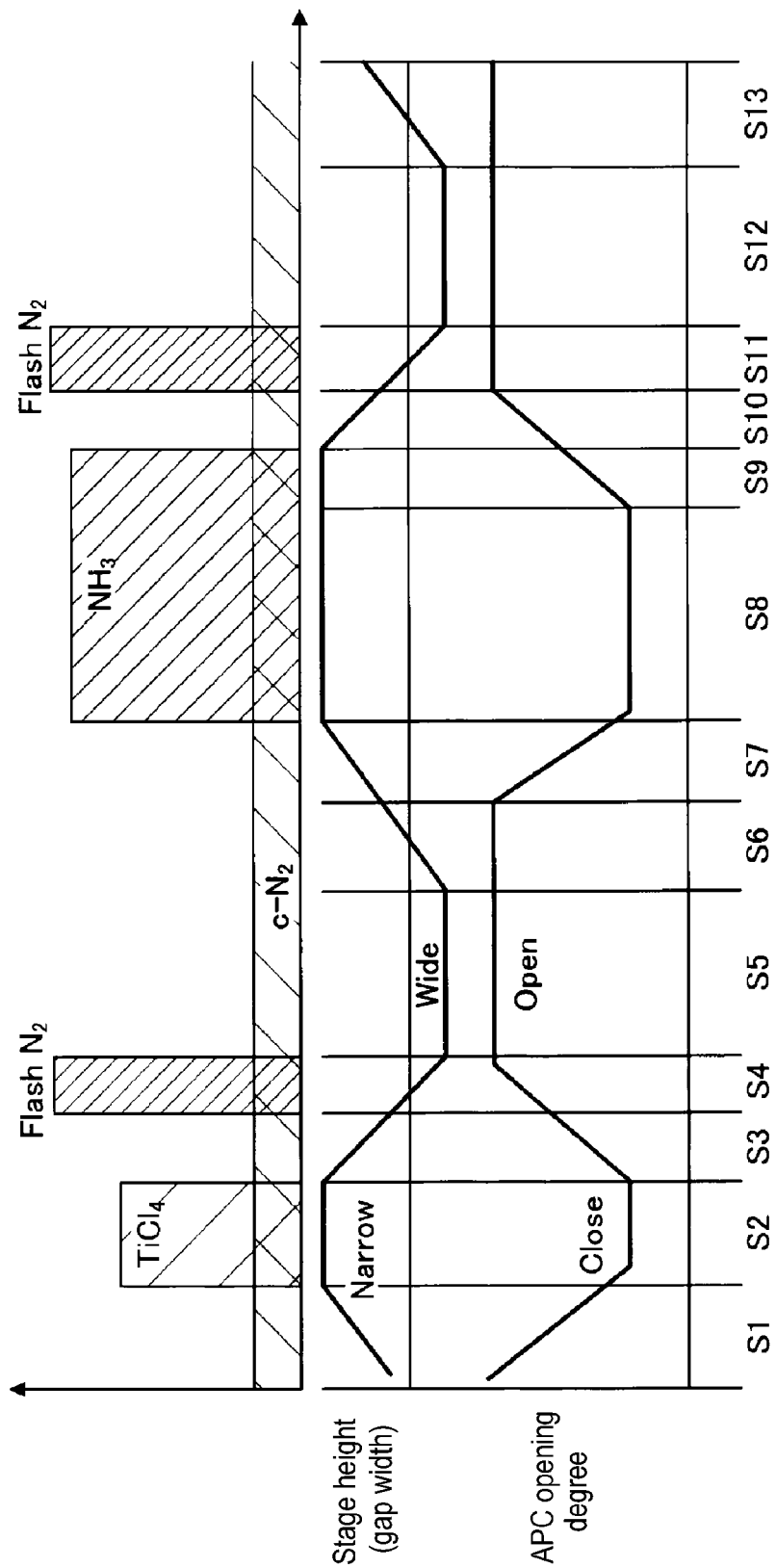
FIG. 8 is a time chart illustrating another exemplary control of gas supply, gap width, and degree of opening of an APC.

In the example illustrated in FIG. 5, it has been described that the supply amount of carrier $N_2$ gas is reduced in the steps of continuously supplying carrier $N_2$ gas, specifically, in the low-pressure steps S5, S6, S12, and S13, the present disclosure is not limited thereto. FIG. 8 is a time chart illustrating another exemplary control of gas supply, gap width, and APC degree of opening. For example, as in another example illustrated in FIG. 8, a configuration, in which carrier $N_2$ gas is continuously supplied, specifically, a configuration, in which carrier $N_2$ gas is supplied constantly, may be employed. In other words, the supply amount of the carrier $N_2$ gas in the low-pressure steps S5, S6, S12, and S13 may be the same as the supply amount of the carrier $N_2$ gas in the adsorption step S2 and/or the reaction steps S8 and S9. In another example illustrated in FIG. 8, the pressure in the processing space 37 is turned into a low pressure in the low-pressure steps by controlling the APC degree of opening.

In addition, although it has been described that both the control of the gap width of the annular gap 38 (the raising and lowering of the substrate placement stage 2) and the adjustment of the degree of opening of the APC valve 42 are performed, the present disclosure is not limited thereto. For example, either one may be used.

Figure 9A:
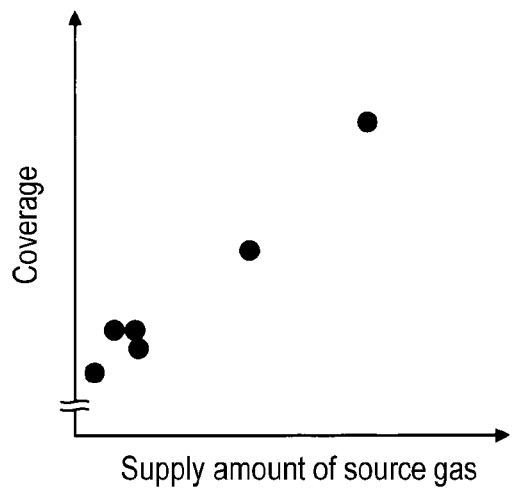
FIG. 9A is an exemplary graph showing a relationship between a supply amount of a source gas and a step coverage.

FIG. 9A is an exemplary graph representing a relationship between a supply amount of a source gas and a step coverage. A vertical axis represents the step coverage, and a horizontal axis represents the supply amount of the source gas. As illustrated in FIG. 9A, as the supply amount of the source gas increases, the step coverage is also improved. In contrast, with the substrate processing apparatus 100 according to the present embodiment, it is possible to increase the partial pressure of the source gas by reducing the gap width of the annular gap 38 and reducing the degree of opening of the APC valve 42 in the adsorption step. By increasing the partial pressure of the source gas, it is possible to increase the amount of the source gas in the processing space 37. As a result, as represented in FIG. 9A, it is possible to improve the step coverage.

Figure 9B:
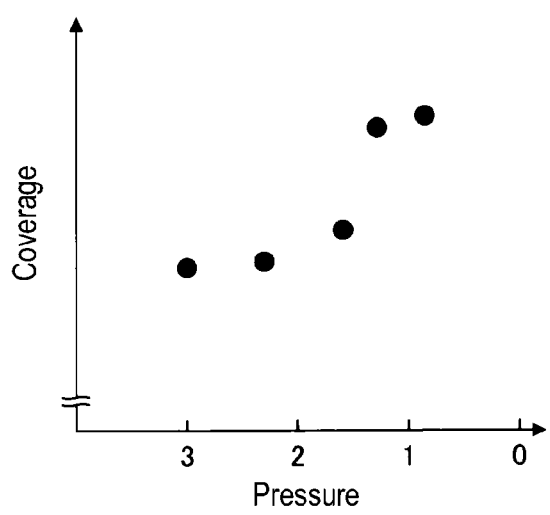
FIG. 9B is an exemplary graph showing a relationship between a pressure during a low-pressure step and a step coverage.

FIG. 9B illustrates an exemplary graph representing the relationship between the pressure and the step coverage during the low-pressure steps (steps S5, S6, S12, and S13). A vertical axis represents the step coverage, and a horizontal axis represents the pressure (the pressure is 0 Torr at the right side and increases toward the left side). As represented in FIG. 9B, as the pressure in the low pressure steps decreases, the step coverage is also improved. For example, in the step of purging the source gas, when unreacted source gas remains near an entrance in the structure 200, the film formation on the entrance side of the structure 200 proceeds earlier than in the inner side, and the structure 200 is closed. For this reason, the step coverage is degraded. The same applies when purging the reaction gas. With the substrate processing apparatus 100 according to the present embodiment, it is possible to decrease the conductance and to decrease the pressure by increasing the gap width of the annular gap 38 and increasing the degree of opening of the APC valve 42 in the purge step. In addition, it is possible to reduce the pressure by reducing the supply amount of the carrier $N_2$ gas. As a result, as represented in FIG. 9B, it is possible to improve the step coverage.

Figure 10:
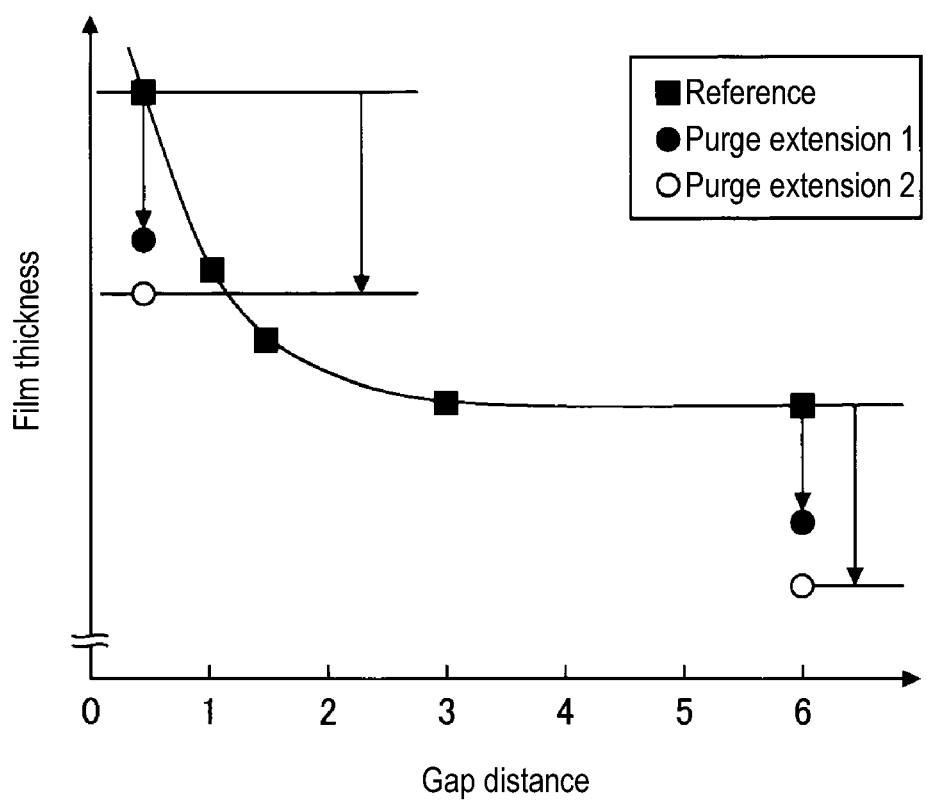
FIG. 10 is an exemplary graph representing a relationship between a gap distance and a film thickness.

FIG. 10 is an exemplary graph representing a relationship between a gap distance and a film thickness. Here, film formation was performed in a predetermined cycle in the state in which the gap width was fixed. The results are indicated by black squares (reference). As represented in FIG. 10, it is confirmed that the film thickness increases in an area in which the gap width is narrow (0.5 mm to 2 mm). That is, with the substrate processing apparatus 100 according to the present embodiment, it is possible to improve use efficiency of the source gas by storing the source gas.

For the gap widths of 0.5 mm and 6.0 mm, the cases where the purge times are longer than the reference purge times indicated by black squares ($N_2$ purge corresponding to steps S3 and S10: 0.1 seconds and flash purge corresponding to steps S4 and S11: 0.2 seconds) are indicated by black circles ($N_2$ purge: 0.4 seconds and flash purge: 0.5 seconds) and white circles ($N_2$ purge: 0.7 seconds and flash purge: 0.8 seconds). Assuming that an insufficient purging of the source gas occurs in a narrow gap width area and the insufficient purging of the source gas does not occur in a wide gap width area, whereby an increase in film thickness occurs in the narrow gap width area, it is considered that, when the purge time is extended, the film thickness will greatly decrease in the narrow gap width area and the decrease in the film thickness will be reduced in the wide gap width area. However, as represented in FIG. 10, when the gap width is 0.5 mm and 6.0 mm, a similar tendency to decrease the film thickness is shown. That is, it is confirmed that the increase in the film thickness in the narrow gap width area is not caused by the insufficient purging of the source gas. In other words, it is confirmed that the use efficiency of the source gas is improved.

Figure 11A:
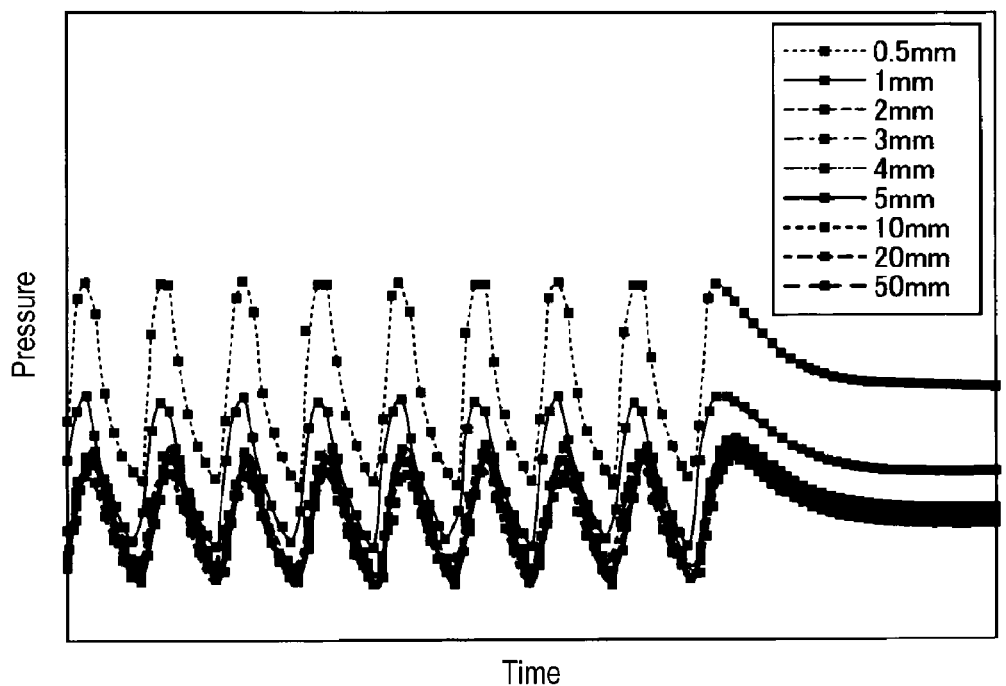
FIGS. 11A and 11B are exemplary graphs representing a pressure change at each gap width.
Figure 11B:
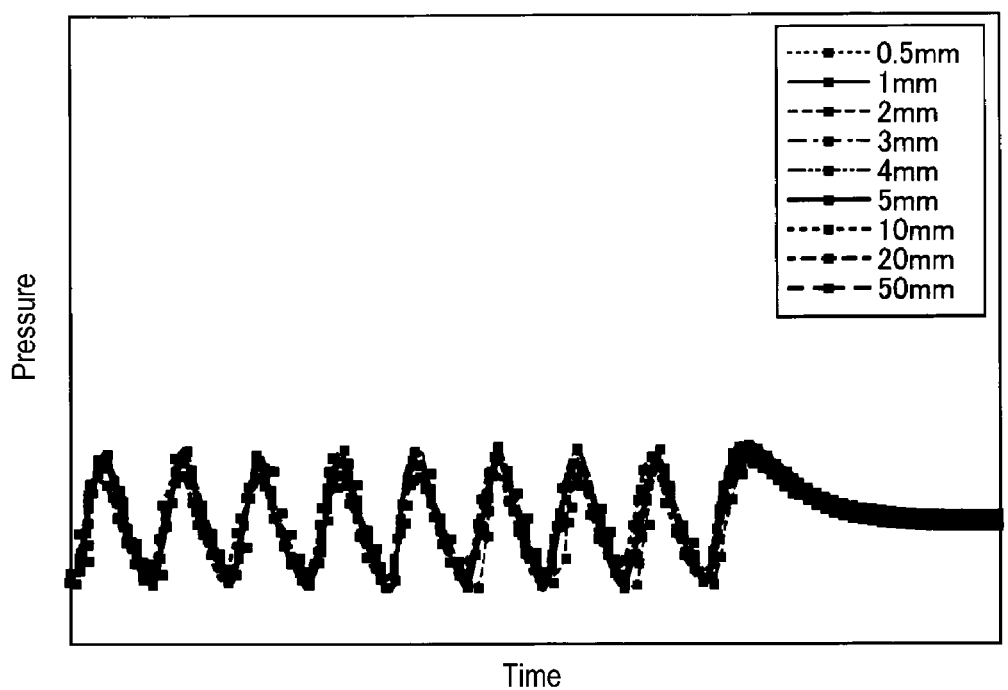

FIGS. 11A and 11B are exemplary graphs each representing a pressure change at each gap width. Here, the change in pressure when the gap width of the annular gap 38 is fixed to each value and the supply and exhaust of the gas to the processing space 37 is repeated is represented. The vertical axis represents pressure, and the horizontal axis represents time. FIG. 11A represents a pressure change in the processing space 37, and FIG. 11B represents a pressure change in the exhaust duct 13.

In the example of the configuration represented in FIG. 11A, it is confirmed that in the area where the gap width was 2 mm or less, the pressure is increased by changing the gap width, that is, the source gas is stored. Meanwhile, in the area in which the gap width is 3 mm or more, the increase in pressure due to the change of the gap width is hardly observed. As described above, the first processing position is to the position at which the source gas is stored, based on the pressure fluctuation represented in FIG. 11A, in other words, the position at which the pressure is increased by changing the gap width (e.g., the position as which the gap width is 0.5 mm). In addition, the second processing position is the position at which the source gas is not stored, based on the pressure fluctuation represented in FIG. 11A, in other words, the position at which the increase in pressure obtained by changing the gap width is small (e.g., the position as which the gap width is 6.0 mm). Further, as illustrated in FIG. 11B, the pressure in the exhaust duct 13 hardly changes regardless of the gap width.

As described above, with the substrate processing apparatus 100 according to the present embodiment, it is possible to improve step coverage when forming the film on the substrate W.

In addition, by reducing the gap width (2.0 mm or less) in the adsorption step S2 and/or the reaction steps S8 and S9), it is possible to store a source gas and/or a reaction gas, and thus to improve the use efficiency of the source gas and/or the reaction gas. Further, the step coverage is improved. In addition, by widening the gap width (3.0 mm or more) in the steps of purging the source gas or the reaction gas (steps S4 to S6 and S11 to S13), it is possible to appropriately purge the source gas or the reaction gas. Further, the step coverage is improved.

In the foregoing, the film formation method of the present embodiment using the substrate processing apparatus 100 has been described. However, the present disclosure is not limited to the above-described embodiments or the like, and can be variously modified and improved within the scope of the present disclosure described in the claims.

Although the case where the TiN film is formed has been described as an example, the type of the film to be formed is not limited thereto. In addition, gas species such as the source gas and the reaction gas are not limited to those described above.

Although the substrate processing apparatus 100 according to the present embodiment has been described as an example of a thermal ALD apparatus, but the present disclosure is not limited thereto, and may be applied to, for example, a plasma ALD apparatus.

According to an aspect, it is possible to provide a substrate processing method and a substrate processing apparatus capable of improving step coverage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method in a substrate processing apparatus comprising: a process container including a placement stage configured to place a substrate thereon and be capable of moving up or down, a member configured to form a processing space between the member and the placement stage, a source gas supply configured to supply a source gas into the process container, a reaction gas supply configured to supply a reaction gas into the process container, and an exhauster including a pressure adjustment valve configured to be capable of adjusting a degree of opening thereof, and exhaust a gas in the process container, the method comprises repeating a cycle, the cycle including:
    supplying the source gas into the process container causing the source gas to be adsorbed to the substrate;
    exhausting excess source gas from the process container;
    supplying the reaction gas into the process container causing the reaction gas to react with the source gas; and
    exhausting excess reaction gas from the process container,
    wherein the degree of opening of the pressure adjustment valve in the supplying the source gas into the process container causing the source gas to be adsorbed to the substrate and the supplying the reaction gas into the process container causing the reaction gas to react with the source gas is smaller than the degree of opening of the pressure adjustment valve in the exhausting the excess source gas from the process container and the exhausting the excess reaction gas from the process container, and
    wherein a gap width between the placement stage and the member in the supplying the source gas into the process container causing the source gas to be adsorbed to the substrate and the supplying the reaction gas into the process container causing the reaction gas to react with the source gas is smaller than a gap width between the placement stage and the member in the exhausting the excess source gas from the process container and the exhausting the excess reaction gas from the process container.

2. The method of claim 1, wherein at least one of the exhausting the excess source gas from the process container and the exhausting the excess reaction gas from the process container include reducing a pressure in the processing space to a pressure lower than a pressure in at least one of the supplying the source gas into the process container causing the source gas to be adsorbed to the substrate and the supplying the reaction gas into the process container causing the reaction gas to react with the source gas.

3. The method of claim 2, wherein the substrate processing apparatus further comprises a carrier gas supply configured to supply a carrier gas, and
    wherein the carrier gas is continuously supplied in the supplying the source gas into the process container causing the source gas to be adsorbed to the substrate, the exhausting the excess source gas from the process container, the supplying the reaction gas into the process container causing the reaction gas to react with the source gas, and the exhausting the excess reaction gas from the process container.

4. The method of claim 3, wherein a supply amount of the carrier gas in the reducing the pressure in the processing space is less than a supply amount of the carrier gas in at least one of the supplying the source gas into the process container causing the source gas to be adsorbed to the substrate and the supplying the reaction gas into the process container causing the reaction gas to react with the source gas.

5. The method of claim 3, wherein a supply amount of the carrier gas in the reducing the pressure in the processing space is equal to a supply amount of the carrier gas in at least one of the supplying the source gas into the process container causing the source gas to be adsorbed to the substrate and the supplying the reaction gas into the process container causing the reaction gas to react with the source gas.

6. The method of claim 2, wherein, in at least one of the exhausting the excess source gas from the process container and the exhausting the excess reaction gas from the process container, the reducing the pressure in the processing space is performed after supplying a purge gas and stopping the supply of the purge gas.

7. The method of claim 6, wherein the substrate processing apparatus further comprises a carrier gas supply configured to supply a carrier gas, and
    wherein the carrier gas is continuously supplied in the supplying the source gas into the process container causing the source gas to be adsorbed to the substrate, the exhausting the excess source gas from the process container, the supplying the reaction gas into the process container causing the reaction gas to react with the source gas, and the exhausting the excess reaction gas from the process container.

8. The method of claim 7, wherein a supply amount of the carrier gas in the reducing the pressure in the processing space is less than a supply amount of the carrier gas in at least one of the supplying the source gas into the process container causing the source gas to be adsorbed to the substrate and the supplying the reaction gas into the process container causing the reaction gas to react with the source gas.

9. The method of claim 8, wherein the gap width between the placement stage and the member is controlled by moving up or down the placement stage.

10. The method of claim 9, wherein the member is a shower plate facing the placement stage.

11. The method of claim 10, wherein the shower plate includes an annular protrusion at a peripheral edge portion thereof,
    wherein the placement stage includes a cover member at a peripheral edge portion thereof, and
    wherein an annular gap width between a bottom surface of the annular protrusion and a top surface of the cover member in the supplying the source gas into the process container causing the source gas to be adsorbed to the substrate and the supplying the reaction gas into the process container causing the reaction gas to react with the source gas is smaller than an annular gap width between the bottom surface of the annular protrusion and the top surface of the cover member in the exhausting the excess source gas from the process container and the exhausting the excess reaction gas from the process container.

12. The method of claim 11, wherein the gap width between the placement stage and the member in at least one of the supplying the source gas into the process container causing the source gas to be adsorbed to the substrate and the supplying the reaction gas into the process container causing the reaction gas to react with the source gas is 2.0 mm or less.

13. The method of claim 1, wherein the gap width between the placement stage and the member is controlled by moving up or down the placement stage.

14. The method of claim 1, wherein the member is a shower plate facing the placement stage.

15. The method of claim 14, wherein the shower plate includes an annular protrusion at a peripheral edge portion thereof,
wherein the placement stage includes a cover member at a peripheral edge portion thereof, and
wherein an annular gap width between a bottom surface of the annular protrusion and a top surface of the cover member in the supplying the source gas into the process container causing the source gas to be adsorbed to the substrate and the supplying the reaction gas into the process container causing the reaction gas to react with the source gas is smaller than an annular gap width between the bottom surface of the annular protrusion and the top surface of the cover member in the exhausting the excess source gas from the process container and the exhausting the excess reaction gas from the process container.

16. The method of claim 1, wherein the gap width between the placement stage and the member in at least one of the supplying the source gas into the process container causing the source gas to be adsorbed to the substrate and the supplying the reaction gas into the process container causing the reaction gas to react with the source gas is 2.0 mm or less.

17. A substrate processing apparatus comprising:
a process container including a placement stage configured to place a substrate thereon and configured to move up or down;
a member disposed to face a placement surface of the placement stage and configured to form a processing space between the member and the placement stage;
a source gas supply configured to supply a source gas into the process container;
a reaction gas supply configured to supply a reaction gas into the process container;
an exhauster including a pressure adjustment valve configured to be capable of adjusting a degree of opening thereof, and exhaust a gas in the process container; and
a controller,
wherein the controller is configured to perform repeating a cycle, the cycle including:
supplying the source gas into the process container causing the source gas to be adsorbed to the substrate;
exhausting excess source gas from the process container;
supplying the reaction gas into the process container causing the reaction gas to react with the source gas; and
exhausting excess reaction gas from the process container,
wherein the controller is configured to perform control such that the degree of opening of the pressure adjustment valve in the supplying the source gas into the process container causing the source gas to be adsorbed to the substrate and the supplying the reaction gas into the process container causing the reaction gas to react with the source gas is smaller than the degree of opening of the pressure adjustment valve in the exhausting excess source gas from the process container and the exhausting excess reaction gas from the process container, and
wherein the controller is configured to perform control such that a gap width between the placement stage and the member in the supplying the source gas into the process container causing the source gas to be adsorbed to the substrate and the supplying the reaction gas into the process container causing the reaction gas to react with the source gas is smaller than a gap width between the placement stage and the member in the exhausting the excess source gas from the process container and the exhausting the excess reaction gas from the process container.

* * * * *